US006455767B1

(12) United States Patent
Müller

(10) Patent No.: US 6,455,767 B1
(45) Date of Patent: Sep. 24, 2002

(54) WEATHER RESISTANT FLAG HAVING A FLAGSTAFF

(76) Inventor: Hermann-Frank Müller, Lyngsbergatr, 3a, D-53177, Bonn (DE)

(*) Notice: Subject to any disclaimer, the term of this patent is extended or adjusted under 35 U.S.C. 154(b) by 0 days.

(21) Appl. No.: 09/687,523

(22) Filed: Oct. 12, 2000

(51) Int. Cl.[7] ................................................ H01L 31/42

(52) U.S. Cl. ....................... 136/245; 136/244; 136/246; 136/291; 362/183; 362/276; 362/812; 362/253; 116/173; 40/604; 40/543; 40/541; 40/218

(58) Field of Search ................................ 136/244, 245, 136/246, 291; 362/183, 276, 812, 253; 116/173; 40/604, 543, 541, 218; 204/194

(56) References Cited

U.S. PATENT DOCUMENTS 5,131,341 A * 7/1992 Newman ................ 114/39.21
6,060,658 A * 5/2000 Yoshida et al. ............ 136/291
6,237,521 B1 * 5/2001 Muller .................... 114/102.2

FOREIGN PATENT DOCUMENTS

DE 19954898 A1 * 8/2000
JP 08-221018 A * 8/1996

* cited by examiner

*Primary Examiner*—Alan Diamond

(57) ABSTRACT

A weather resistant flag is provided which includes a flagstaff, a flag cloth mountable on the flagstaff, solar cells mounted on at least one of the flag cloth and the flagstaff, and an energy storage device for storing energy generated by the solar cells. The solar cells can be in the form of solar cell strips and can be transparent in the event that they are mounted over business advertising symbols that may be provided on the flag.

13 Claims, 2 Drawing Sheets

Figure2
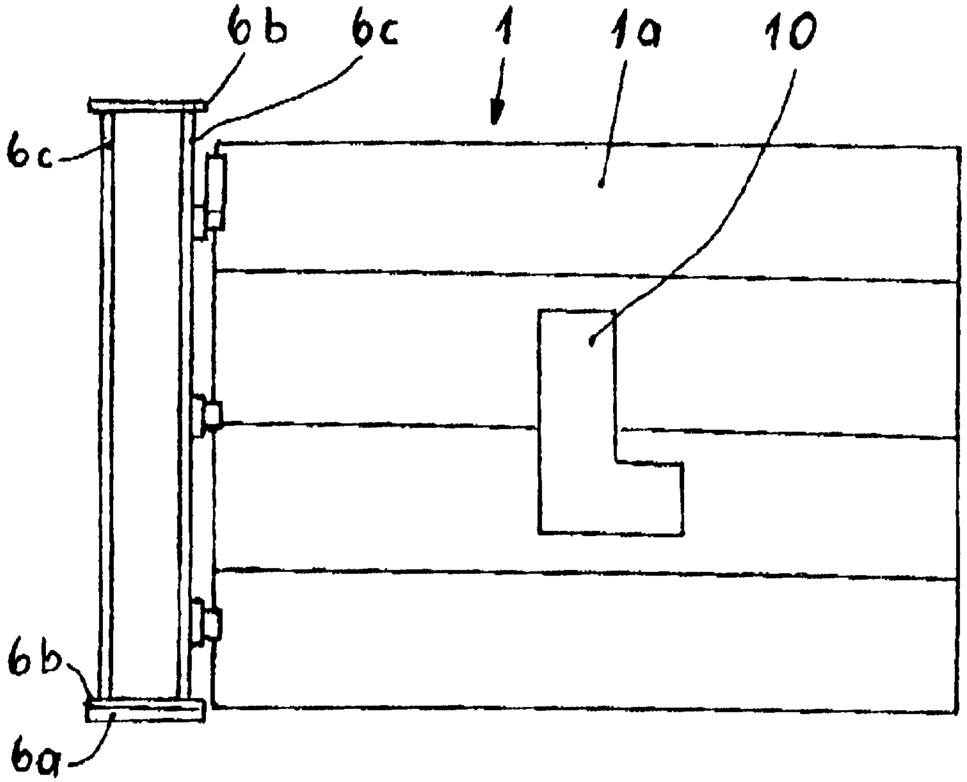
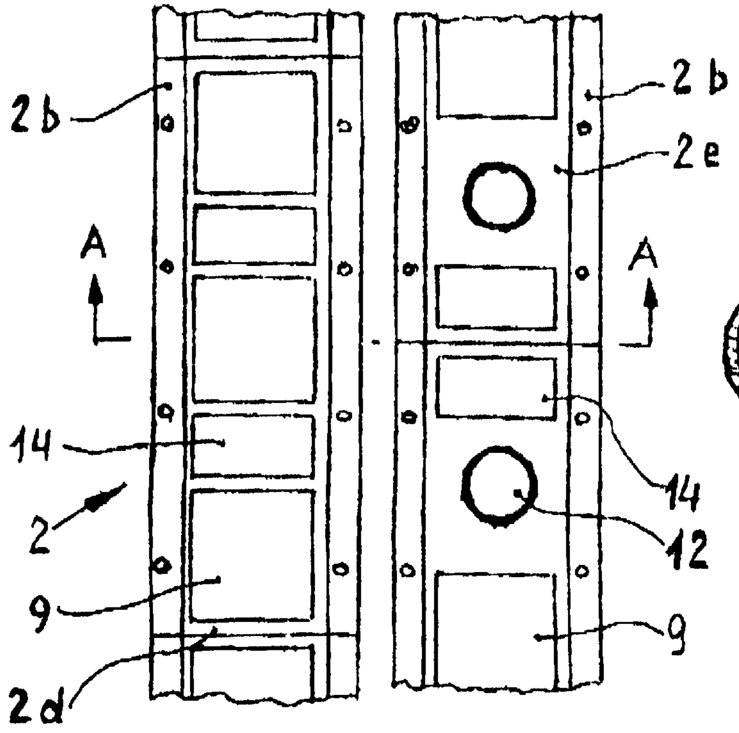
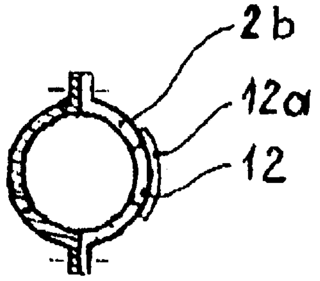
Figure3b
Figure3a

WEATHER RESISTANT FLAG HAVING A FLAGSTAFF

BACKGROUND OF THE INVENTION

The present invention relates to a weather resistant flag or banner having an associated flagstaff.

The invention is proposed in fulfillment of the challenge posed in the patent application DE 100 024 88.2 relating to a weather resistant flag having an associated flagstaff which can be manufactured in a cost effective manner independent of the actual dimensions thereof, the flag being raisable and lowerable by means of a motor which need not be powered from an external source, and having the greatest possible flexibility of use.

DE 100 024 88.2 describes a flag having solar cells whose efficiency can be increased by coupling with an electrolyzer of a fuel cell. The energy thus obtained can be conducted to a light emitting film comprised of organic material OLED and/or comprised of polymeric material PLED and/or can be conducted to a third party energy user.

A light emitting film and/or a gate with pinpoint LEDs (light emitting diodes) operate to provide a uniform distribution of light beneath the flag. The light film can also be comprised of a fluorescing material.

It can therefore be advantageous to filter the dew or condensation water on the flagstaff and/or to conduct the rain water on the flagstaff through a gutter or channel system to a water container. Moreover, a funnel can be mounted on the flagstaff or at a spacing from the flagstaff. A gravel belt can be provided at the base of the flagstaff and the water can thereby be filtered enroute to a water container. To the same end, a reformer can be configured as it is done, for example, in the automobile industry.

Solar cells are provided outside of and/or inside of the staff or above or below the flag cloth. An electrolyzer separates the water into hydrogen and oxygen, the water being supplied from conduction water, source water, dew water, or rainwater and which serves as an energy source. A fuel cell produces electricity.

The flagstaff can also be disposed immediately adjacent to a gas conduit. The fuel cell converts this gas as well into electricity. The electrolyzer and the fuel cell can use hydrogen, gas mixtures, and oxygen as a gas storage system.

Energy storage can be provided in the base or in the body of the flagstaff and/or on the flag cloth.

Flags and banners have found use through the centuries as identification of peoples and organizations. In recent times, flags have proven themselves as an advertising medium for company symbols and their economic output (DE 39 39 085 A1). For this reason, there has been a change and enlargement of, among other things, the range of working materials used for the flag cloth. In lieu of a material such as, for example, linen, which can be embellished with colors as well as, in some circumstances, artwork, metals of various types and synthetic material compositions can now be found, whereby the dimension, weather resistance, intended usages, and the like can play a large role. These same value criteria count as well for the configuration of the associated flagstaff comprised of, for example, aluminum (DE 27 06 944), some other metal, or polymeric material.

SUMMARY OF THE INVENTION

The present invention provides a solution to the challenge of configuring a weather resistant flag or banner and associated flagstaff which can be manufactured in an economical manner independent of its dimensions, can be raised and lowered without the need for a motor powered by an outside source, and whose flexibility of use is maximized.

The present invention proposes, as a solution to this challenge, a configuration in which solar cell strips are secured to both a weather resistant flag cloth preferably formed of synthetic material and the associated flagstaff, and which comprises as well an energy storage device to which the energy captured by the solar cell strips is conducted and from which energy is drawn to power various power users.

DE 199 02 012 and U.S. Pat. No. 5,131,341 suggest the disposition of flexible or bendable solar cells on a sail cloth in order to generate electricity for various electrical power users; however, devices are needed for such configurations in order to adapt the solar cells, which are practically unchangeable in their dimensions, to the weather dictated changes in the sail cloth. DE 26 29 085 A1 suggests a synthetic rustle web as a flag cloth which is tear- and rust-resistant. In a comparison of flag cloth material in Column 3 of DE 27 34 045 C3, the advantages of a polyester web are recognizable. A single sided synthetic coating is frequently sufficient for those solar cell strips which are to appear as substitute strips of the same color- and/or text-composition as the flag cloth portions they will substitute for; however, the removability of such strips should not be overlooked. In any event, the solar cell strips, which are of a colored background which can portray a picture or a writing character, must either exhibit the color tone of the relevant color composition or must be sufficiently transparent so that the background with the color composition is recognizable.

In addition to providing solar cell strips on flag cloth, flagstaffs can be provided with solar cell strips mounted thereto in a removable manner on the inside, if desired, as well as the outside of the staffs. As disclosed in DE 38 10 260 A1 and DE 195 29 995 A1, it is known, to ensure that the last available light is conducted to the solar cell strips, to provide openings or, respectively, recesses, adequately dimensioned and covered with a thickened covering which does not hinder the transmission therethrough of light.

In order to increase the light yield and, thus, the energy generation, the possibility exists to dispose mirrors on the interior of a tube shaped flagstaff with the mirrors being operable to distribute the incoming light among several solar cell strips. The construction of the openings or recesses in the flagstaff can comprise various materials but can as well comprise at least one removably mountable transparent solar cell.

The flagstaff can, in correspondence with its length, be comprised of one of the types of rotatable flagstaff operable to support a flag cloth and having one or more components which can be assembled together with one another in, for example, a bendable arrangement involving a joint (DE 29 03 664 C2) or an arrangement in which the components are inserted into one another (DE 32 04 977A1). Such assembled arrangements facilitate necessary repair work or an exchange of solar cell strips within the flagstaff. It is self-evident that a conductor for conducting the energy should be provided between the individual flagstaff components.

As the flagstaff deployment location cannot always be sited such that light throughout the entire day optimally falls on the solar cell strips on the flagstaff, and as sometimes devices must necessarily be mounted on the flagstaff which cannot accommodate thereon solar cell strips, it can be necessary to rotate the flagstaff independent of the uppermost flagstaff component, whose orientation is determined by the wind. This rotation of the flagstaff can be accomplished manually or by a solar energy powered motor which can, in a desired situation, be automatically actuated via a switch associated with a sensor (U.S. Pat. No. 4,079,555). The possibility exists in any event to accomplish the raising and lowering of the flag by a solar energy powered motor, which can as desired in the event of slackening wind, operate a pressurized air device in order to supply pressurized air through the interior of the flagstaff to slots in the uppermost flagstaff component associated with the flag cloth for unfurling of the flag cloth (DE 195 29 995 A1).

BRIEF DESCRIPTION OF THE DRAWINGS

The weather resistant flag or banner and its associated flagstaff of the present invention is exemplarily described in the description hereafter following which includes these drawings:

FIG. 2 is a view of another embodiment of a flag of the present invention and its associated flagstaff that includes a flagstaff sleeve for supporting a flag cloth;

FIG. 3*a* is a sectional view of a portion of a flagstaff showing two semi-cylindrical portions of the flagstaff portion in opened side-by-side relation to one another; and FIG. 3*b* is a top view of the portion of the flagstaff shown in FIG. 3*a* and showing the two portions in assembled together condition.

DETAILED DESCRIPTION OF THE PREFERRED EMBODIMENTS

Figure 1:
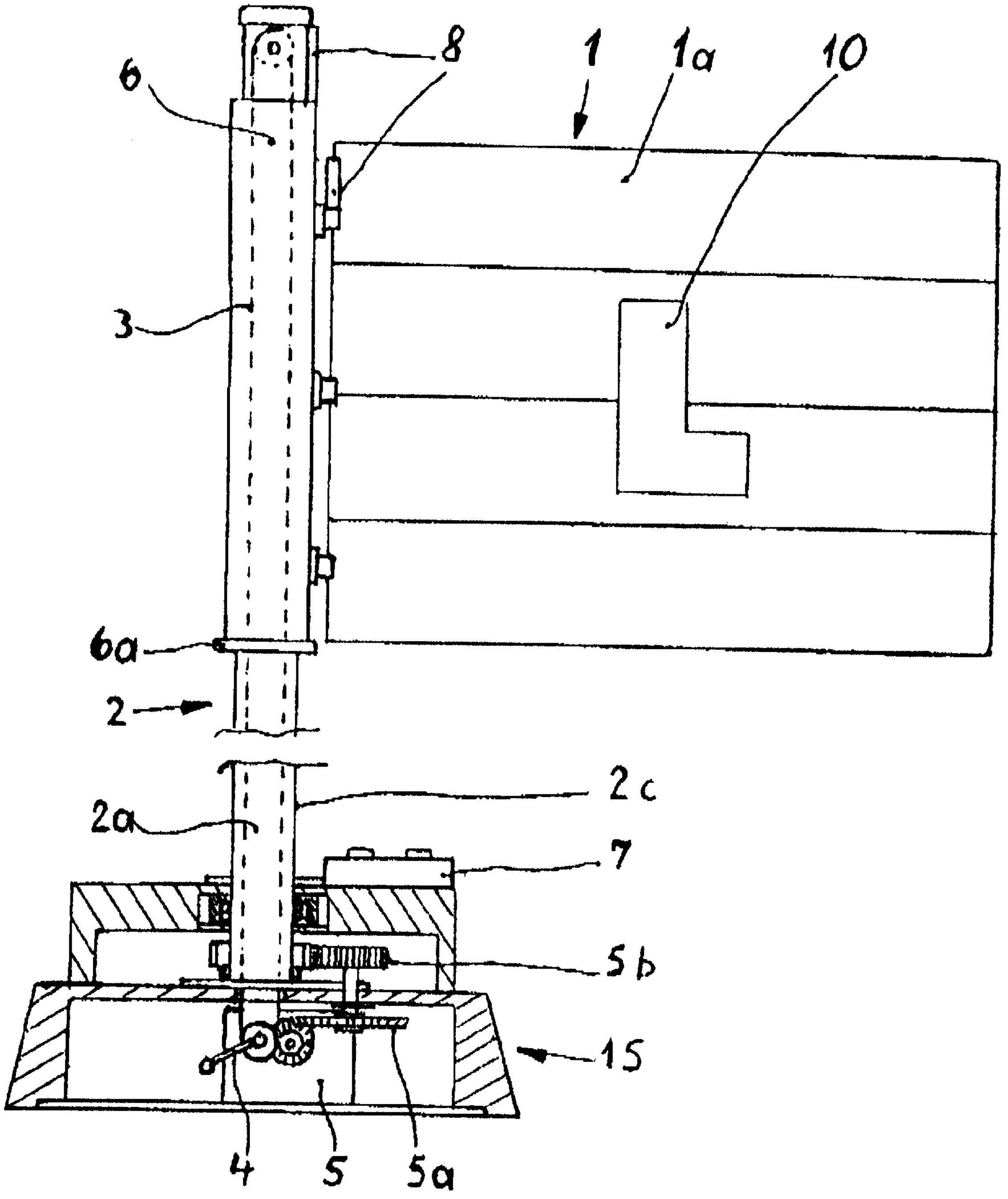
FIG. 1 is a view of one embodiment of a flag of the present invention and a partial sectional view of its associated flagstaff.

A weather resistant flag 1, which is preferably formed of synthetic material, is mounted on a flagstaff 2 such that the flag can be raised and lowered as desired. In this regard, an endless cable-, belt-, or chain pull 3 can be provided, which is operable via a crank 4 or via a motor 5 of a desired type operating through a correspondingly arranged gear 5*a*.

The flag cloth 1*a* is secured, for example, by a current conducting magnetic insert mounting system to a tube sleeve 6 which itself is slidably mounted on the flagstaff 2. To preclude an unintended lowering of the flag 1, the tube sleeve 6 can, for example, be provided on its lower end, in the central opening, with a plate 6*a* having an outwardly biased clamp element which can be placed out of operation through conventional means such as, for example, mechanical or electromagnetic means, in the event that the flag 1 is to be lowered.

In the case of flag cloths 1*a* of reduced dimension and correspondingly reduced mass, the tube sleeve 6 can—as seen in FIG. 2—comprise two plates 6*b* which define the respective upper and lower ends of the flag cloth 1*a* and which are connected to one another via at least two diametrically arranged iron plates 6*c*.

As it is preferred that the flag 1 should be in the maximum unfurled and extended condition, it is necessary that the flag can adapt to wind directions. To ensure that this occurs with reduced rubbing or friction, a roller bearing (not shown), for example, is disposed on the plate 6*a* on which the tube sleeve 6 of the flag 1 is supported.

Flags are used for business purposes to enhance recognition of a company or its products. For this reason, a suitable lighting of the flag 1 and, above all, the symbol 10 carried thereon, is required in the event of unfavorable viewing conditions and, especially, darkness. In order to have available the current required for such a lighting task, solar cells in the form, in particular, of solar cell strips, are secured on the flag 1 for the purpose of converting light into electrical energy. This electrical energy is collected in an energy storage device 8 which is located in the vicinity of the solar cell strips such as, for example, on the flag 1 and/or on the flagstaff 2.

The solar cell strips mounted on the flag cloth 1*a* must be colored in such a manner that the symbol 10 provided on the flag is not covered by the solar cell strips. This means that the solar cell strips are either transparent or are colored in a manner corresponding to the coloring of the symbol 10 on which they are mounted. If a flag 1 comprises only a few symbols 10 and, moreover, the color of the flag cloth 1*a* is perhaps not of importance, the possibility exists, of course, to mount the solar cell strips only at locations where none of the symbols 10 are present. Such an arrangement, however, amounts to a relinquishment of the maximum energy yield which could otherwise be obtained. In contrast, the energy amount is greater if the solar cell strips are mounted on both sides of the flag cloth 1*a*. This arrangement provides, in addition, the advantage that the same mounting elements can each be used to simultaneously secure two of the solar cell strips.

A simplified arrangement can be achieved if the flag cloth 1*a* is comprised of solar cell strips interconnected with one another, whereby this interconnection can be released as required—for example, a zipper—or the interconnection can instead be configured as non-releasable. Since it is intended that the flag cloth 1*a* should be weather resistant, it is self-evident that the solar cell strips in their entirety—that is, including the electrically conductive interconnection (for example, a press fitted interconnection)—are provided with a protective layer which is water shedding and which discourages the accumulation thereon of dirt (Lotus effect). Moreover, the light transmissivity through the protective layer should not be hindered. An arrangement of the solar cell strips in a "back to back" manner on both sides of the flag cloth 1*a* provides the advantage, if transparent solar cell strips are used, that light falling on one solar cell strip also falls on the backside solar cell strip and thereby increases the amount of generated energy.

Solar cell strips, especially in stripe-form, are likewise disposed on the outer periphery 2*c* of the flagstaff 2, whereby a releasable connection mountable, for example, necessary repairs, would then be recommended for the typically metal flagstaff 2 (for example, an aluminum flagstaff described in DE 27 06 944) only in the event that an unpermitted removal of the currently relatively costly solar cells can be essentially ruled out.

A mounting, however, of the solar cell strips 9 in the interior of the flagstaff 2 is possible, as shown in FIG. 3*a*. In this arrangement, the pipe or tube of the flagstaff 2 has thereon, as seen in FIG. 3*b*, a covering 12*a* which comprises closeable access openings 12 through which the solar cell strips 9 can be removably inserted into the interior of the flagstaff 2. The covering 12*a*, which is understandably mounted in a secured manner, is configured such that it cannot effectively be shattered and does not degrade the stability of the flagstaff 2. Additionally, the covering must permit sufficient light passage therethrough to reach the solar cell strips in the interior of the flagstaff 2. These requirements dictate the choice of an appropriate material for the covering 12*a* such as, for example, plastic, glass, or transparent solar cells. In order to better distribute the light reaching the interior of the flagstaff 2, mirrors 14 can, for example, be provided.

To facilitate the installation of the solar cell strips 9 into the interior of the flagstaff 2, it may be necessary to configure the flagstaff 2 out of multiple components, either out of several tube components 2*a* which are, for example, linked via a chain with one another (DE 29 03 664 C2), or comprised of half tubes 2*d*, 2*e*, which are releasably connected to one another in an opposed manner, as shown in FIGS. 3*a* and 3*b*. In any event, care should be taken that there is no break in the electrical connection of the solar cells or, respectively, the solar cell strips 9, with one another, to the energy storage device 8, and therefrom to the energy take off device available to the energy user. It is to be understood that, in the configuration of a multiple component flagstaff 2, the individual flagstaff components 2*a* or, respectively, 2*b* are sealed off relative to one another.

The deployment location of the flagstaff 2 may not always be a location at which sufficient light reception throughout the entire day is available, especially as concerns the solar cell strips 9 in the interior of the flagstaff 2. For this reason, there is disposed in the flagstaff footing 15 a solar powered electro-motor 5 which is operable not only to raise and lower the flag 1 but also to effect rotation, via a corresponding gear follower 5*b*, of the flagstaff component 2*a* having solar cell strips mounted interiorly thereon independently of the wind direction which unfurls and extends the flag cloth 1*a*. The rotation of the flagstaff component 2*a* can, in fact, be effected manually via, for example, a crank 4; however, the rotation which can be provided by the electro-motor 5 may be more effective and precise in an arrangement in which the electro-motor 5 is aided by a sensor 7, connected to the electro-motor via switches, for measuring the direction of the strongest light intensity. The location at which the sensor 7 is to be installed such as, for example, on the flagstaff footing 15, is to be determined based upon the respective deployment location of the flagstaff 2.

The raising and lowering of the flag 1 as well as the rotation of the flagstaff components 2*a* requires electrical energy which can be made available by the solar cells. As a rule, the energy generation of the numerous solar cells will be, however, considerably higher than the energy needed by the flag for its own operation. The energy collected in the energy storage device 8, as is conventionally known, can therefore be used, in particular, to permit illumination of the business advertising symbol 10 on the flag cloth 1*a* during darkness, be it through small diodes (OLED, Organic Light-emitting Diodes; or PLED, Polymeric Light-emitting Diodes), through light bands, through a light sheet or the like (see DE 196 32 719 A1) which are most likely less energy demanding than an illumination of the flag cloth 1*a* (see DE 197 14 220 A1) as that requires a considerable amount of energy.

The use of the stored energy by "flag alien" users should be dependent upon the use of a "key" as in a special check card, a fingerprint sensor, or the like, in the manner of further transmission or receipt of information via, for example, radio or light bands, as a light housing, and so forth (compare in this regard the abstract of the title page of U.S. Pat. No. 5,383,296).

A further use, for example, is a GMS system operable to transmit information via a conductor.

The specification incorporates by reference the disclosure of German priority documents 199 49 266.2 of Oct. 12, 1999, 100 02 488.2 of Jan. 1, 2000 and 100 50 649.5 of Oct. 12, 2000.

The present invention is, of course, in no way restricted to the specific disclosure of the specification and drawings, but also encompasses any modifications within the scope of the appended claims.

What I claim is:

1. A weather resistant flag or banner, comprising:

a flagstaff;

a flag cloth mountable on the flagstaff;

at least one flexible solar cell mounted on the flag cloth and and on and in the flagstaff; and an energy storage device mounted to the flagstaff or flag cloth for storing energy generated by the solar cells.

2. A weather resistant flag or banner according to claim 1, wherein the energy storage device is mounted on the flag cloth.

3. A weather resistant flag or banner according to claim 1, wherein the flagstaff includes at least two components mountable to one another in an over and under relation lengthwise manner, the flag cloth being mountable on the upper one of the flagstaff components and the upper one of the flagstaff components being rotatable with respect to the lower one of the flagstaff components in response to wind on the flag cloth and further comprising a solar energy conducting connector between the at least two components.

4. A weather resistant flag or banner according to claim 1, wherein flexible solar cells mounted on the flag cloth have a light transmissive property allowing the passage of light therethrough such that the background coloring of the flag cloth underlying the solar cells are visible.

5. A weather resistant flag or banner according to claim 1, wherein flexible solar cells are mounted to both sides of the flag cloth.

6. A weather resistant flag or banner according to claim 1, wherein flexible solar cells are releasably mounted to the flag cloth.

7. A weather resistant flag or banner according to claim 1, wherein the felxible solar cells are in the form of solar cell strips which are flexible, non-releasably mounted to neighboring solar cell strips, and of a coloring corresponding to a flag coloring.

8. A weather resistant flag or banner according to claim 1, wherein the flagstaff includes a hollow interior and a protective layer permitting light passage therethrough, flexible solar cells are mounted on the interior of the flagstaff, and openings are formed in the flagstaff for permitting light to pass to the interior of the flagstaff for receipt by the solar cells mounted inside the flagstaff.

9. A weather resistant flag or banner according to claim 8, and further comprising at least one mirror disposed in the flagstaff for distributing light to a plurality of the solar cells mounted inside the flagstaff.

10. A weather resistant flag or banner according to claim 8, wherein the protective layer includes at least one releasably mounted transparent solar cell.

11. A weather resistant flag or banner according to claim 1, wherein the flagstaff includes at least two components mountable to one another in an over and under relation lengthwise manner, the flag cloth being mountable on the upper one of the flagstaff components and the upper one of the flagstaff components being rotatable with respect to the lower one of the flagstaff components, and a lower one of the components is rotatable independent of the other components for adjusting the position of solar cells to thereby facilitate the receipt of light on the solar cells.

12. A weather resistant flag or banner according to claim 11, and further comprising a motor for rotating the independently rotatable lower component, and a sensor connected to the motor for sensing light and transmitting a signal to the motor for actuation thereof in response to sensed light on the sensor.

13. A weather resistant flag or banner according to claim 1, and further comprising a motor for raising and lowering the flag cloth.

* * * * *